United States Patent [19]

Mori

[11] Patent Number: 4,775,803
[45] Date of Patent: Oct. 4, 1988

[54] BASE DRIVE CIRCUIT OF TRANSISTOR
[75] Inventor: Haruyoshi Mori, Hyogo, Japan
[73] Assignee: Mitsubishi Denki Kabushiki Kaisha, Tokyo, Japan
[21] Appl. No.: 37,836
[22] Filed: Apr. 13, 1987
[30] Foreign Application Priority Data
Apr. 15, 1986 [JP] Japan .................................. 61-84992
[51] Int. Cl.$^4$ ...................... H03K 17/60; H03K 3/26; H03K 3/33; C05F 1/40
[52] U.S. Cl. ................................... 307/254; 307/270; 307/300; 323/289
[58] Field of Search ............... 307/254, 255, 270, 300; 323/289

[56] References Cited
U.S. PATENT DOCUMENTS

| 4,302,807 | 11/1981 | Mentler | 323/289 |
| 4,566,060 | 1/1986 | Hoeksma | 323/289 |
| 4,605,865 | 8/1986 | Yuzurihara | 307/300 |
| 4,634,903 | 1/1987 | Montorfang | 307/300 |
| 4,638,240 | 1/1987 | Pauker et al. | 307/300 |

OTHER PUBLICATIONS

Technical Committee for Investigating Rectifier, "Technical Report of the Institute of Electrical Engineers of Japan", Part II, No. 162, Jan. 1984, pp. 9-12. Institute of Electrical Engineers of Japan, "CT Feedback Transistor Chopper Apparatus for Electric Automobiles", Feb. 15, 1977.

Primary Examiner—Stanley D. Miller
Assistant Examiner—B. P. Davis
Attorney, Agent, or Firm—Bernard, Rothwell & Brown

[57] ABSTRACT

The invention relates to technology to minimize power for suppressing ON base current to a transistor. In a base drive circuit of transistor, current is supplied to base of first and second transistors connected in series to DC power source, and the transistors are rendered on or off. The base drive circuit comprises a current transformer using as a primary winding an AC bus connected in parallel between the joint of the first and second transistors and having a secondary winding energized by current of the primary winding and inducing current; a switching circuit including a first rectifier element for rectifying current induced in any portion of the secondary winding of the current transformer, a first switching element for supplying the rectified current outputted from the first rectifier element to the base of any of the first and second transistors, an initial current supply circuit for supplying initial current to the base of the transistor supplied with the rectified current in superposition of the current flowing through the first switching element, and a second switching element in bypass connection so as not to supply the rectified current to the base of the transistor; and a second rectifier element for rectifying current induced in any other portion of the secondary winding of the current transformer, and an overvoltage suppression circuit comprising a reset circuit connected in series to the second rectifier element for applying reset to the core of the current transformer.

13 Claims, 6 Drawing Sheets

BASE DRIVE CIRCUIT OF TRANSISTOR

BACKGROUND OF THE INVENTION

1. Field of the Invention

The present invention relates to base drive circuits of transistors, and more specifically to a base drive circuit of transistor wherein power to supply ON base current to a transistor is made as small as possible.

2. Description of the Prior Art

Figure 1:
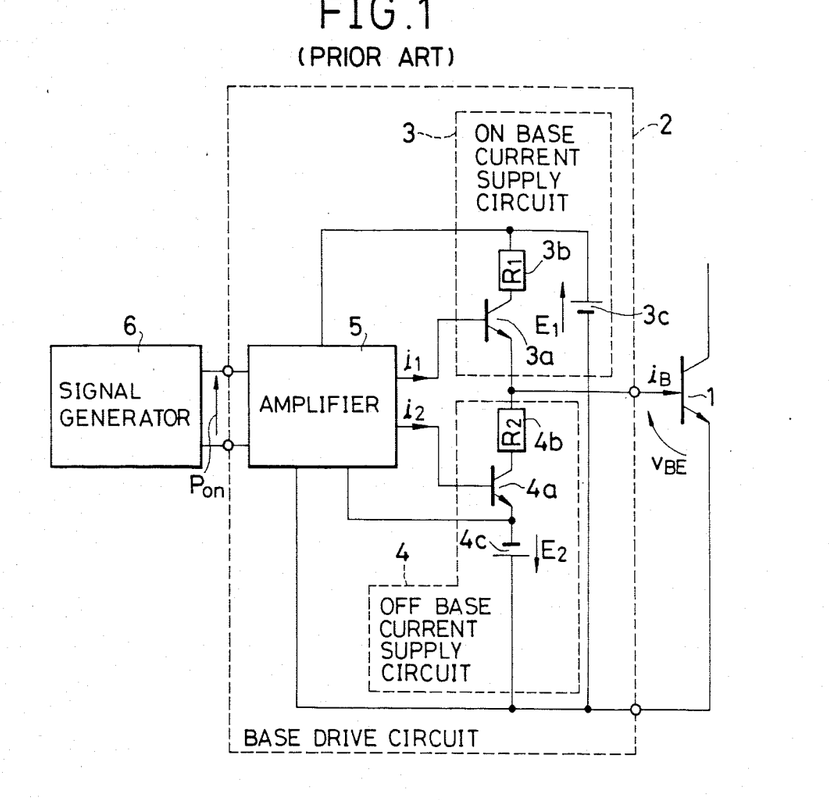
FIG. 1 is a circuit diagram of a base drive circuit of transistor as an example of the prior art.

A base drive circuit of transistor as an example in the prior art is disclosed in Technical Report of the Institute of Electrical Engineers of Japan (Part II) No. 162, FIG. 3.19. The prior art described in the reference as shown in FIG. 1 broadly comprises a main transistor 1, a base drive circuit 2 for driving the main transistor 1, and a signal generator 6 for giving ON/OFF command to the base drive circuit 2. The base drive circuit 2 comprises an ON base current supply circuit 3 for supplying ON base current to the main transistor 1, an OFF base current supply circuit 4 for supplying OFF base current to the main transistor 1, and an amplifier 5 for amplifying the ON/OFF command to the main transistor 1. The ON base current supply circuit 3 and the OFF base current supply circuit 4 are provided with transistors 3a, 4a rendered on or off alternately according to command of the amplifier 5, resistors 3b, 4b for limiting the ON current and the OFF current of the transistors 3a, 4a, and power sources 3c, 4c for supplying the ON current and the OFF current to the circuits 3, 4, respectively.

Next, operation of the base drive circuit shown in FIG. 1 will be described referring to FIGS. 2(a) to (f) showing operation waveform of each part of the circuit in FIG. 1.

Figure 2:
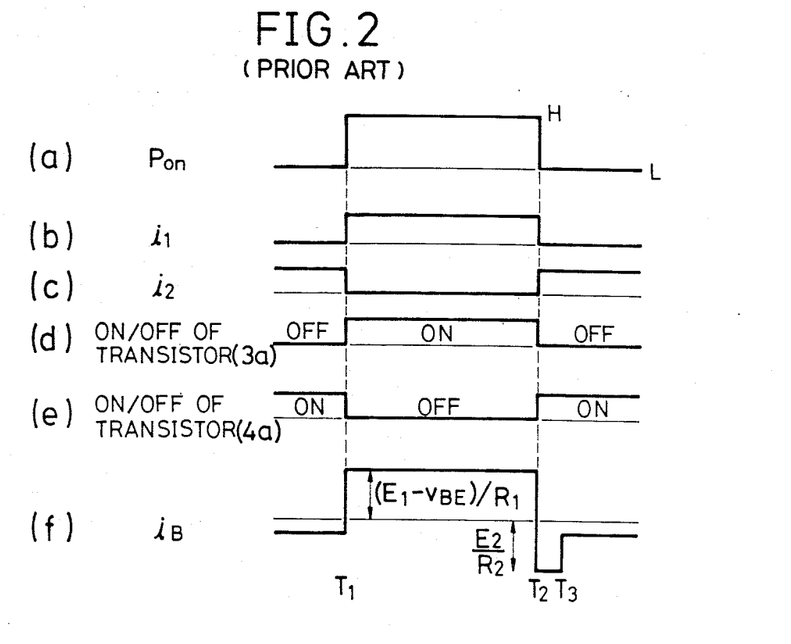

At time $T_1$, if signal Pon for rendering the main transistor 1 on is supplied from the signal generator 6 to the amplifier 5 as shown in FIG. 2(a), since the amplifier 5 supplies on base current $i_1$ to the transistor 3a as shown in FIG. 2(b), the transistor 3a of the ON base current supply circuit 3 is rendered on by the ON base current $i_1$. Thereby the base of the main transistor 1 is supplied with current $$i_B = (E_1 - V_{BE})/R_1 \tag{1}$$

determined by the resistor 3b (resistance value $R_1$) and the power source 3c (voltage $E_1$) and forward voltage $V_{BE}$ between base and emitter of the main transistor 1 so as to render the main transistor 1 on.

At time $T_2$, if the ON command Pon becomes L, since output of the amplifier 5 supplies current so that the transistor 4a is turned on and the transistor 3a is turned off, the base of the main transistor 1 is supplied with current $$i_B = -E_2/R_2$$

(where $E_2$: source voltage of 4c, $R_2$: resistance value of 4b). Thereby storage carrier of the main transistor 1 is lost and the main transistor 1 is rendered off at time $T_3$. After the time $T_3$, current determined by equivalent resistance between base and emitter of the main transistor 1 flows.

Since the base drive circuit of the prior art is constituted as above described, in order to render the main transistor on, if base current as specified by equation (1) is supplied without depending on variation of base emitter voltage of the main transistor (usually, $V_{BE}$ = about 1-3V in Darlington transistor), a power source considerably higher than the maximum of $V_{BE}$ is required. If the power source of $E_1 = 7$ V is used to supply the base current $i_B = 3$ A and the main transistor is operated at a condition of conduction rate 50%, a large power of $\frac{1}{2} \times ($ 7 V $\times 3$ A$) = 10.5$W is required only to supply the ON base current. Accordingly, the power source for the base drive circuit must be of large capacity when a large base current must be supplied to the transistor or when the number of transistors is increased.

SUMMARY OF THE INVENTION

In order to eliminate the above-mentioned disadvantages in the prior art, an object of the invention is to provide a base drive circuit wherein power to supply the ON base current is made as small as possible.

In a base drive circuit of transistor according to the invention, each winding of a current transformer installed on an AC bus is provided with a rectifier circuit so that current supplied by the current transformer flows through the secondary winding and the tertiary winding corresponding to the polarity of the main circuit current, current from the secondary winding is supplied to base of the main transistor according to ON command to the main transistor bus and is not supplied to base of the main transistor at OFF command state, and the core of the current transformer is reset at mode of current flowing in the tertiary winding.

BRIEF DESCRIPTION OF THE DRAWINGS

FIGS. 2(a) to 2(f) show an operation waveform chart illustrating operation of each part of the base drive circuit shown in FIG. 1;

DETAILED DESCRIPTION OF THE PREFERRED EMBODIMENTS

Preferred embodiments of the invention will now be described referring to the accompanying drawings.

Figure 3:
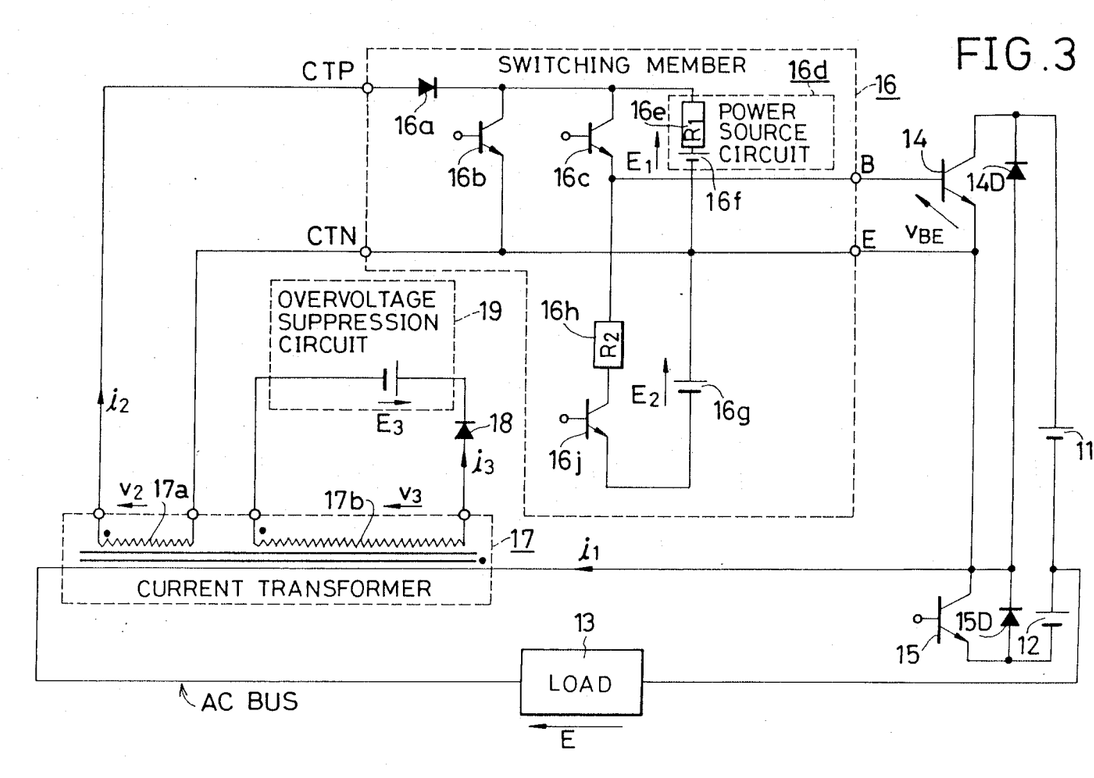
FIG. 3 is a circuit diagram of a base drive circuit as a first embodiment of the invention.
Figure 4:
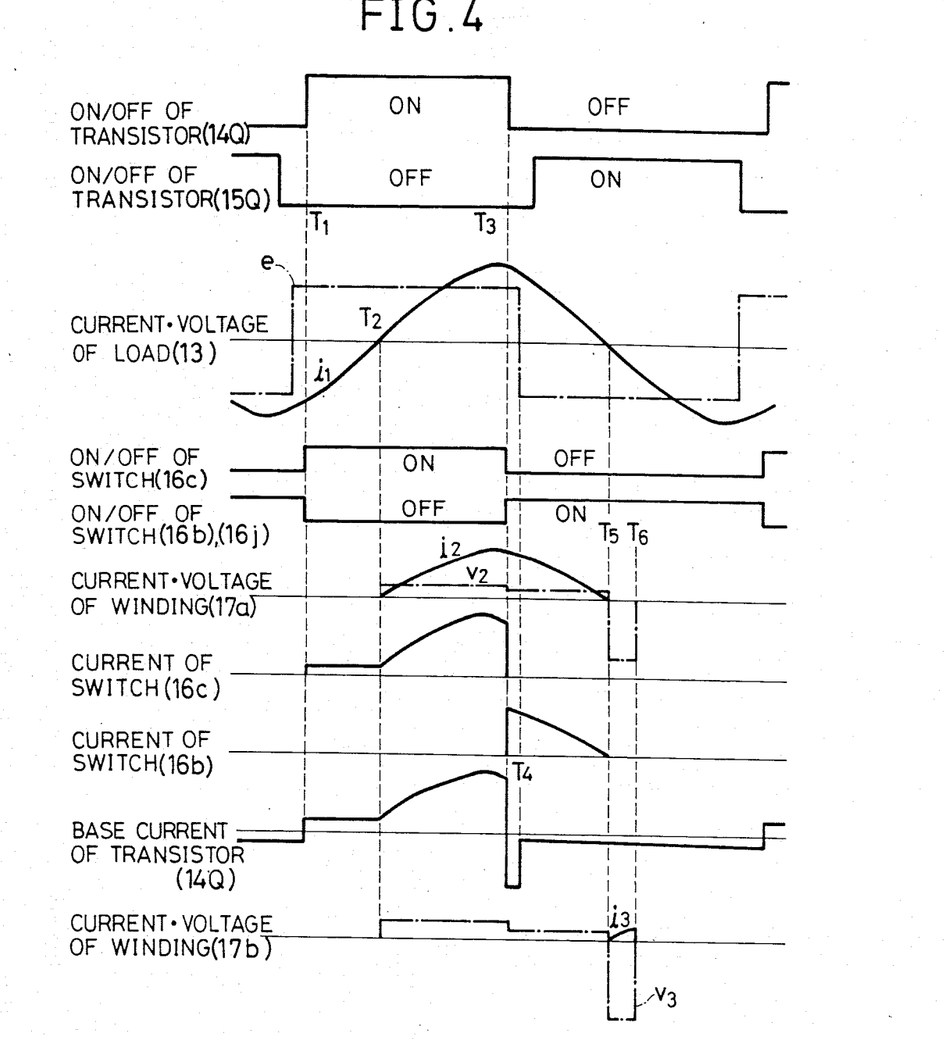
FIG. 4 is an operation waveform chart illustrating operation of each part of the base drive circuit shown in FIG. 3.

FIG. 3 and FIG. 4 are a circuit diagram and an operation waveform chart illustrating a base drive circuit of transistor according to the invention, respectively. In FIG. 3, the base drive circuit broadly comprises DC power sources 11, 12 in series connection, a load 13, main transistors 14, 15 connected in series to the DC power sources 11, 12 and constituting main circuit, a switch member 16 of the base drive circuit, a current transformer 17, diode 18, and an overvoltage suppression circuit 19.

AC bus having he load 13 is connected between the joint of the main transistors 14, 15 constituting the main circuit and the joint of the DC power sources 11, 12. Feedback diodes 14D, 15D are connected in parallel to the main transistors 14, 15 respectively.

The switch member 16 of the base drive circuit comprises diode 16a, a switching element 16b for bypass, a switching element 16c for supplying base current to the main transistor 14, a power source circuit 16d as initial current supply circuit composed of a resistor 16e and a power source 16f for supplying initial base current, a power source 16g for OFF operation, a switching element 16j turned on when the main transistor 14 is rendered off, and a resistor 16h for limiting the OFF current.

The current transformer 17 uses the AC bus as primary winding and has a secondary winding 17a and a tertiary winding 17b. The tertiary winding 17b is connected in series to the diode 18 and the overvoltage suppression circuit 19, and acts to reset the core of the current transformer 17.

FIG. 4 is an operation waveform chart of each part of the circuit shown in FIG. 3, and the operation of the circuit of FIG. 3 will now be described referring to the operation waveform chart. Assume that the connected load is the inductive load 13 and the main transistors 14, 15 are switched in timing shown in FIG. 4 thereby AC current $i_1$ flows in the AC bus. Since the main transistors 14, 15 perform the same operation at a difference of a period of half cycle, operation at side of the transistor 14 will be described here as an example.

In order that the main transistor 14 is rendered on at time $T_1$, the switch 16c is turned on. Since no current flows from the secondary winding 17a at the time $T_1$, base of the main transistor 14 is supplied with current $$\frac{E_1 - V_{BE}}{R_1} \quad (2)$$

determined by the power source 16f of the circuit 16d (voltage $E_1$) of the circuit 16d supplying initial current, the resistor 16e (resistance value $R_1$) and base-emitter voltage $V_{BE}$ of the main transistor 14.

If polarity of the current $i_1$ of the AC bus is inverted at time $T_2$, the diode 16a is rendered conductive and base of the main transistor 14 is supplied with sum of the above-mentioned current (2) through the switch 16c and current $$i_2 = \frac{N_2}{N_1} i_1 \quad (3)$$

from the secondary winding 17a of the current transformer 17 ($N_1$: the number of turns of primary winding, $N_2$: the number of turns of secondary winding), that is, current $$\frac{E_1 - V_{BE}}{R_1} + \frac{N_2}{N_1} i_1 \quad (4)$$

Then, if the switch 16c is assumed to be an ideal switch, forward voltage of the diode 16a and base-emitter voltage $V_{BE}$ of the main transistor 14 are applied to the secondary winding 17a.

In order that the main transistor 14 is rendered off at time $T_3$, the switch 16c is turned off and the bypassing switch 16b is turned on a thereby current of the secondary winding 17a is not supplied to the base of the main transistor 14. At the same time, the OFF switch 16j is turned on; thereby the base of the main transistor 14 is supplied with base current $$-\frac{E_2}{R_2}$$

determined by the OFF source 16g (voltage $E_2$) and the resistor 16h (resistance value $R_2$). Thus the main transistor 14 is rendered off at time $T_4$. From the time $T_4$ until time $T_5$ as hereinafter described, if the switch 16b is assumed to be an ideal switch, forward voltage of the diode 16a is applied thereto.

If polarity of the AC bus current $i_1$ is inverted at the time $T_5$, the diode 16a is rendered off and the diode 18 connected to the tertiary winding 17b l is rendered conductive. As a result, voltage $E_3$ of the overvoltage suppression circuit 19 begins to be applied to the tertiary winding 17b, and until time $T_6$ to eliminate the voltage time product applied to the core of the current transformer 17 by the secondary winding 17a from the time $T_2$ to the time $T_5$. Current $$i_3 = \frac{N_1}{N_3} i_1 \quad (5)$$

($N_3$: the number of turns of the tertiary winding 17b) flows through the diode 18 into the overvoltage suppression circuit 19. During this period the core of the current transformer 17 is excited reversely and placed in the reset state.

Figure 5:
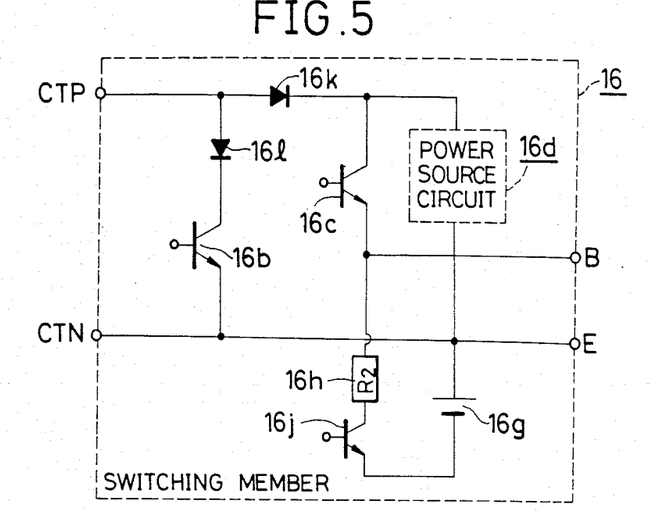
FIG. 5 and FIG. 6 are circuit diagrams of base drive circuits as second and third embodiments of the invention respectively illustrating switch members of different constitution.

Although one diode 16a to rectify the secondary current of the current transformer 17 is installed per the secondary winding 17a of the current transformer 17 in the above embodiment, the invention is not limited to this, but as shown in a second embodiment of FIG. 5 diodes 16k, 16l may be installed separately on a path to supply the base current and a path to shortcircuit it.

Figure 6:
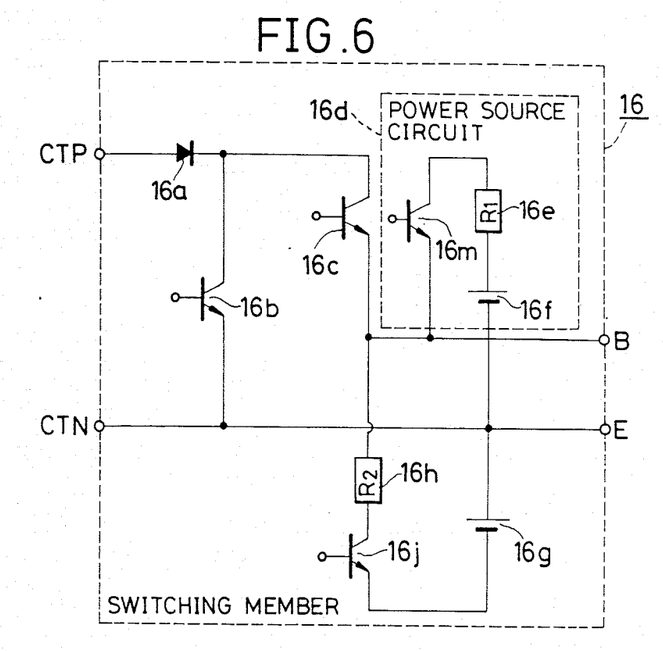

Also as shown in a third embodiment of FIG. 6, a circuit 16d to supply initial current may include a switch 16m so that the initial current is supplied to base of the main transistor 14 without passing through the switch 16c.

In the first embodiment, although the overvoltage suppression circuit 19 is connected to the tertiary winding 17b of the current transformer 17 as shown in FIG. 3, it may be commonly used with that for resetting another current transformer.

Also in the first embodiment, although the half-wave rectifier circuit is shown as the rectifying means for the tertiary winding 17b, it may be constituted by a full-wave rectifier circuit.

Figure 7:
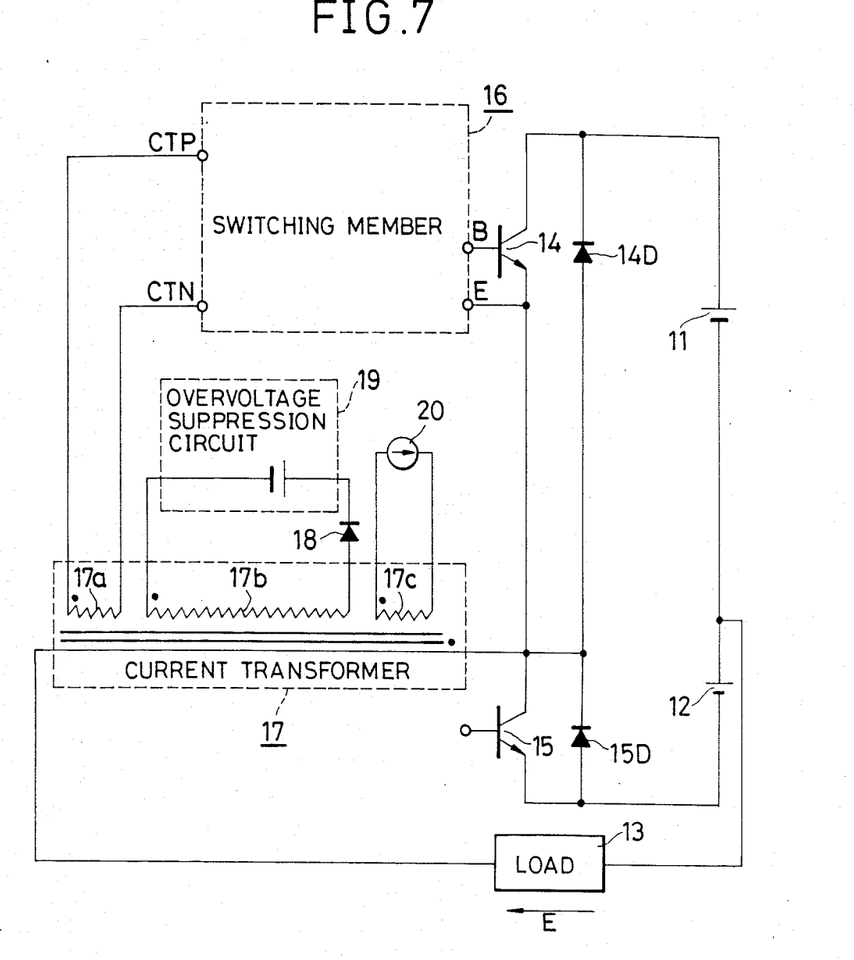
FIG. 7 is a circuit diagram of a base drive circuit as a fourth embodiment of the invention.

Although the current transformer 17 comprises the secondary winding 17a connected to the switch member 16, and the tertiary winding 17b connected in series to the diode 18 and the overvoltage suppression circuit 19 in the above description, the invention is not limited to this but as shown in a fourth embodiment of FIG. 7 if the current transformer 17 is provided with a quartic winding 17c and DC power source 20 to suppress AC ripple is connected in series to the quartic winding 17c so that DC current flows in the quartic winding 17c, the core of the current transformer 17 can be reset securely even at the starting state of the inverter device.

Although any of the embodiments is used in an inverter of the half-bridge voltage feed type in the above description, the invention may be used in an inverter of the full-bridge type or may be applied to an inverter of the current feed type.

As above described in detail, according to the base drive circuit of transistor of the invention, most of the base current to be supplied to the main transistor is supplied by the current transformer installed on the AC bus, and current flowing in the circuit during the ON eriod of the main transistor is decreased securely, thereby power supplied to operate the base drive circuit can be reduced.

What is claimed is:

1. A base drive circuit for transistors, wherein current is supplied to bases of first and second transistors, the transistors having a common junction and being connected in series to a DC power source, and the transistors are turned on or off, said base drive circuit comprising:
   a current transformer having a core and using as a primary winding an AC bus connected in parallel between said common junction of the first and second transistors and having secondary through n-th windings (n: positive integer) energized by current of the primary winding and inducing current;
   a switching means including a first rectifier element for rectifying current induced in any of the secondary through n-th windings of the current transformer; a first switching element for supplying the rectified current outputted from the first rectifier element to the base of either of the first and second transistors; an initial current supply circuit for supplying initial current to the base of the transistor to which the rectified current outputted from the first rectifier element is supplied in superposition on the current flowing through the first switching element; and a second switching element for bypassing the rectified current so as not to be supplied to the base of the transistor to which the rectified current outputted from the first rectified element is supplied; and
   an overvoltage suppression means including a second rectifier element connected to any of the secondary through n-th windings for rectifying current induced in the winding, and supplying reverse excitation to the core of the current transformer and thereby to reset the core of the current transformer.

2. A base drive circuit as set forth in claim 1, wherein the switching means is connected to the secondary winding of the current transformer.

3. A base drive circuit as set forth in claim 1, wherein the overvoltage suppression means is connected to a tertiary winding of the current transformer.

4. A base drive circuit as set forth in claim 1, wherein DC power source having an AC ripple current suppression function is connected to a quartic winding of the current transformer.

5. A base drive circuit as set forth in claim 1, wherein the first rectifier element installed in the switching element is constituted by diode performing half-wave rectification of current induced in the secondary winding of the current transformer.

6. A base drive circuit as set forth in claim 5, wherein said first rectifier element is installed separately in a path to supply base current and a path to shortcircuit it.

7. A base drive circuit as set forth in claim 1, wherein the initial current supply circuit constituting the switching means is composed of a resistor for supplying the initial current to base of the transistor at supply side of the rectified current, and a power source circuit comprising a power source connected in series to the resistor.

8. A base drive circuit as set forth in claim 1, wherein the initial current supply circuit constituting the switching means is composed of a resistor for supplying initial current, a DC power source, and a third switching element in series connection, said initial current supply circuit being connected in parallel between base and emitter of the transistor at the supply side of the rectified current.

9. A base drive circuit as set forth in claim 8, wherein said third switching element is composed of transistor.

10. A base drive circuit as set forth in claim 1, wherein the first and second switching elements constituting the switching means are composed of transistors.

11. A base drive circuit as set forth in claim 1, wherein the switching means is constituted by an inverter device of the half-bridge voltage feed type.

12. A base drive circuit as set forth in claim 1, wherein the switching means is constituted by an inverter device of the full-bridge voltage feed type.

13. A base drive circuit as set forth in claim 1, wherein the switching means is constituted by an inverter device of the current feed type.

* * * * *

UNITED STATES PATENT AND TRADEMARK OFFICE
CERTIFICATE OF CORRECTION

PATENT NO. : 4,775,803

DATED : October 4, 1988

INVENTOR(S) : Haruyoshi Mori

It is certified that error appears in the above-identified patent and that said Letters Patent is hereby corrected as shown below:

Column 2, line 7, delete "(b7V x 3A)" and substitute --(7V x 3A)--.

Column 2, line 64, delete "he" and substitute --the--.

Column 3, line 45, delete "$i_2 = \frac{N_2}{N_1} i_1$" and substitute --$i_2 = \frac{N_1}{N_2} i_1$--.

Column 3, line 55, delete "$+\frac{N_2}{N_1} i_1$" and substitute --$+\frac{N_1}{N_2} i_1$--.

Column 4, line 14, delete "17b 1 is" and substitute --17b is--.

Signed and Sealed this

Twenty-fifth Day of April, 1989

Attest:

DONALD J. QUIGG

Attesting Officer

Commissioner of Patents and Trademarks